(12) United States Patent
Amick et al.

(10) Patent No.: US 6,650,157 B2
(45) Date of Patent: Nov. 18, 2003

(54) USING A PUSH/PULL BUFFER TO IMPROVE DELAY LOCKED LOOP PERFORMANCE

(75) Inventors: Brian Amick, Austin, TX (US); Claude Gauthier, Fremont, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 110 days.

(21) Appl. No.: 10/044,103

(22) Filed: Jan. 11, 2002

(65) Prior Publication Data

US 2003/0132790 A1 Jul. 17, 2003

(51) Int. Cl.[7] .............................. H03L 7/06; H03L 7/00
(52) U.S. Cl. ....................... 327/158; 327/161; 327/149
(58) Field of Search ................................ 327/149, 150, 327/153, 158, 159, 161, 55, 65, 89, 563; 330/253

(56) References Cited

U.S. PATENT DOCUMENTS

| 5,179,303 A | * | 1/1993 | Searles et al. ............... 327/277 |
| 5,705,947 A | * | 1/1998 | Jeong ......................... 327/270 |
| 6,125,157 A | * | 9/2000 | Donnelly et al. ............ 375/371 |
| 6,222,422 B1 | * | 4/2001 | Opris .......................... 331/25 |

OTHER PUBLICATIONS

"Low–Jitter Process–Independent DLL and PLL Based on Self–Biased Techniques", by John G. Maneatis as published in the IEEE Journal of Solid–State Circuits, vol. 31, No. 11, Nov., 1996.
"A Semidigital Dual Delay–Locked Loop", by Stefanos Sidiropoulos, (student member, IEEE), and Mark A. Horowitz (senior member, IEEE), as published in the IEEE Journal of Solid–State Circuits, vol. 32, No. 11, Nov., 1997.

* cited by examiner

Primary Examiner—Tuan T. Lam
(74) Attorney, Agent, or Firm—Rosenthal&Osha L.L.P.

(57) ABSTRACT

A delay locked loop that uses a differential push/pull buffer is provided. The differential push/pull buffer of the DLL is used to create a buffered output that closely follows the characteristics of the buffer's input over a range of temperature, power supply noise operating conditions, and process (manufacturing) variations. Further, an integrated circuit that contains a delay locked loop that uses a differential push/pull buffer is provided. Further, a delay locked loop with means for buffering a delayed signal is provided. Further, a method for buffering a delayed clock signal using a differential push/pull buffer is provided.

44 Claims, 6 Drawing Sheets

USING A PUSH/PULL BUFFER TO IMPROVE DELAY LOCKED LOOP PERFORMANCE

BACKGROUND OF INVENTION

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

Figure 1:
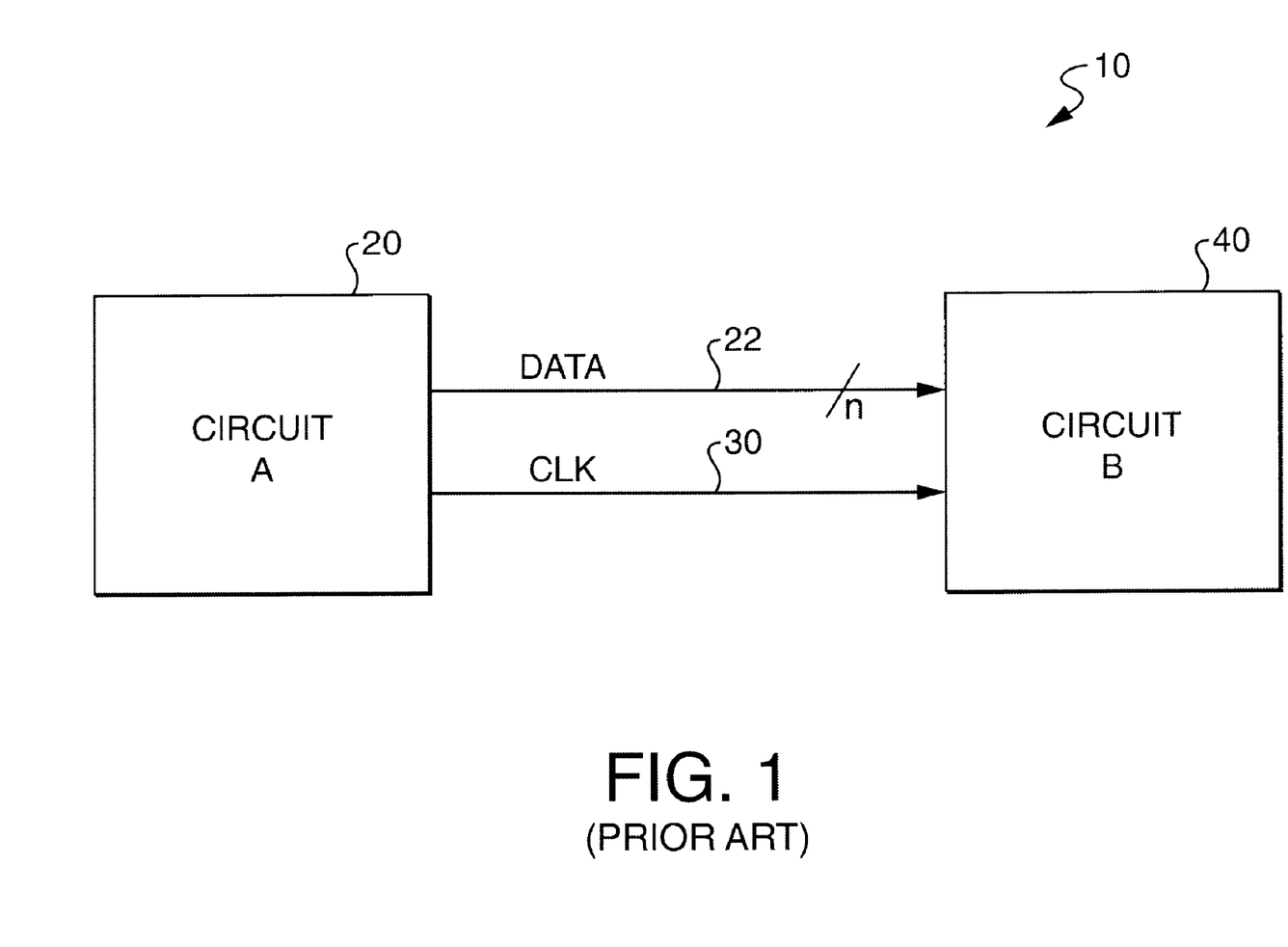
FIG. 1 shows a typical computer system component.

FIG. 1 shows a section of a typical computer system component (10). Data (22) that is 'n' bits wide is transmitted from circuit A (20) to circuit B (40). To aid in the recovery of the transmitted data, a clock composed of a clock signal (30), or CLK, is also transmitted with the data. The circuits could also have a path to transmit data from circuit B (40) to circuit A (20) along with an additional clock (not shown). The clock signal (30) may transition from one state to another at the beginning of the data transmission. Circuit B (40) requires a signal temporally located some time after the beginning of the valid data. Furthermore, the clock signal (30) may have degraded during transmission. The DLL has the ability to regenerate the clock signal (30) to a valid state and to create a phase shifted version of the clock to be used by other circuits, for example, a receiver's sampling signal. The receiver's sampling signal determines when the input to the receiver should be sampled.

The DLL must delay an output signal versus an input signal by a known phase shift. The entire cycle of a signal is considered a 360 degree phase shift. By specifying a phase shift delay, the same relative delay is specified; however, the absolute amount of delay may be different. For example, a 100 MHz clock signal has a 10 ns cycle time; therefore, a phase shift of 360 degrees would indicate that an entire cycle, or 10 ns, of delay has been added. A 30 degree phase shift is approximately 0.833 ns. A 200 MHz clock signal has a cycle time of 5 ns. A 30 degree phase shift is approximately 0.417 ns. The phase shifts in these examples are the same; however, the temporal delays are not.

Figure 2:
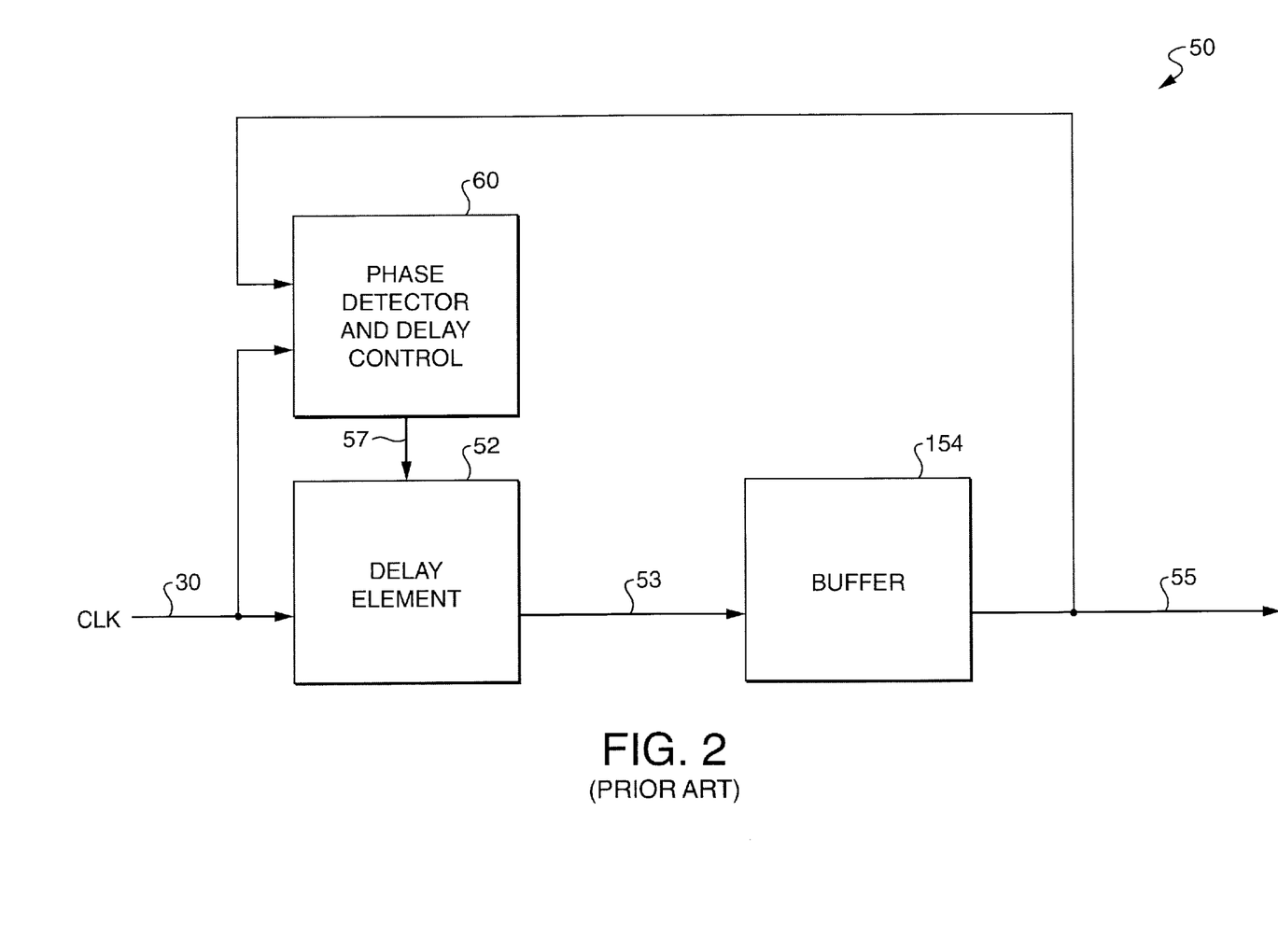
FIG. 2 shows a delay locked loop block diagram.

In FIG. 2, a DLL (50) is composed of three basic components: a delay element (52), a buffer circuit (54), and a phase detector and delay control (60). The delay element (52) generates a delayed signal (53) that is delayed relative an input signal (30). For this example, the input signal (30) is CLK. The phase detector and delay control (60), or phase adjustment device, controls the amount of delay generated by the delay element (52) based on the phase difference between the input signal (30) and a buffered output signal (55). The buffer circuit (54) takes the delayed signal (53) from the delay element (52) and buffers the delayed signal (53) to any circuits that must receive a buffered output signal (55), such as a receiver's sampling signal. By buffering the output signal (53), the characteristics of the delay element (52) are not changed due to the capacitive and/or resistive load on the delayed signal (53).

SUMMARY OF INVENTION

According to one aspect of the present invention, a delay locked loop comprises a delay element that outputs a delayed signal that is delayed relative to an input signal, a differential push/pull buffer adapted to receive the delayed signal to generate a buffered output signal, and a phase adjustment device operatively connected to the delay element to adjust the delay of the delay element based on a phase difference between the input signal and the buffered output signal.

According to another aspect, an integrated circuit comprises a delay locked loop that comprises a delay element that outputs a delayed signal that is delayed relative to an input signal, a differential push/pull buffer adapted to receive the delayed signal to generate a buffered output signal, and a phase adjustment device operatively connected to the delay element to adjust the delay of the delay element based on a phase difference between the input signal and the buffered output signal.

According to another aspect, a delay locked loop comprises delaying means for delaying an input signal and outputting a delayed signal, buffering means for buffering the delayed signal and outputting a buffered output signal, and adjusting means for adjusting a degree of delay of the delaying means based on a phase difference between the input signal and the buffered output signal.

According to another aspect, a method for generating a sampling clock comprises inputting a clock signal to a delay element; generating a delayed clock signal that is delayed relative to the clock signal; inputting the delayed clock signal to a differential push/pull buffer; and buffering the delayed clock signal to generate a buffered clock signal.

Other aspects and advantages of the invention will be apparent from the following description and the appended claims.

DETAILED DESCRIPTION

Embodiments of the present invention relate to a delay locked loop circuit that uses a differential push/pull buffer to create a buffered output that closely follows input characteristics over a range of temperature, power supply noise operating conditions, and process (manufacturing) variations. Embodiments of the present invention further relate to an integrated circuit that uses a differential push/pull buffer in a DLL to create a buffered output that closely follows input characteristics over a range of temperature, power supply noise operating conditions, and process (manufacturing) variations. Embodiments of the present invention further relate to a means for generating a buffered output using a differential push/pull buffer in a DLL to create a buffered output that closely follows input characteristics over a range of temperature, power supply noise operating conditions, and process (manufacturing) variations. Embodiments of the present invention further relate to a method that buffers an output signal from a delay element using a differential push/pull buffer.

Figure 3:
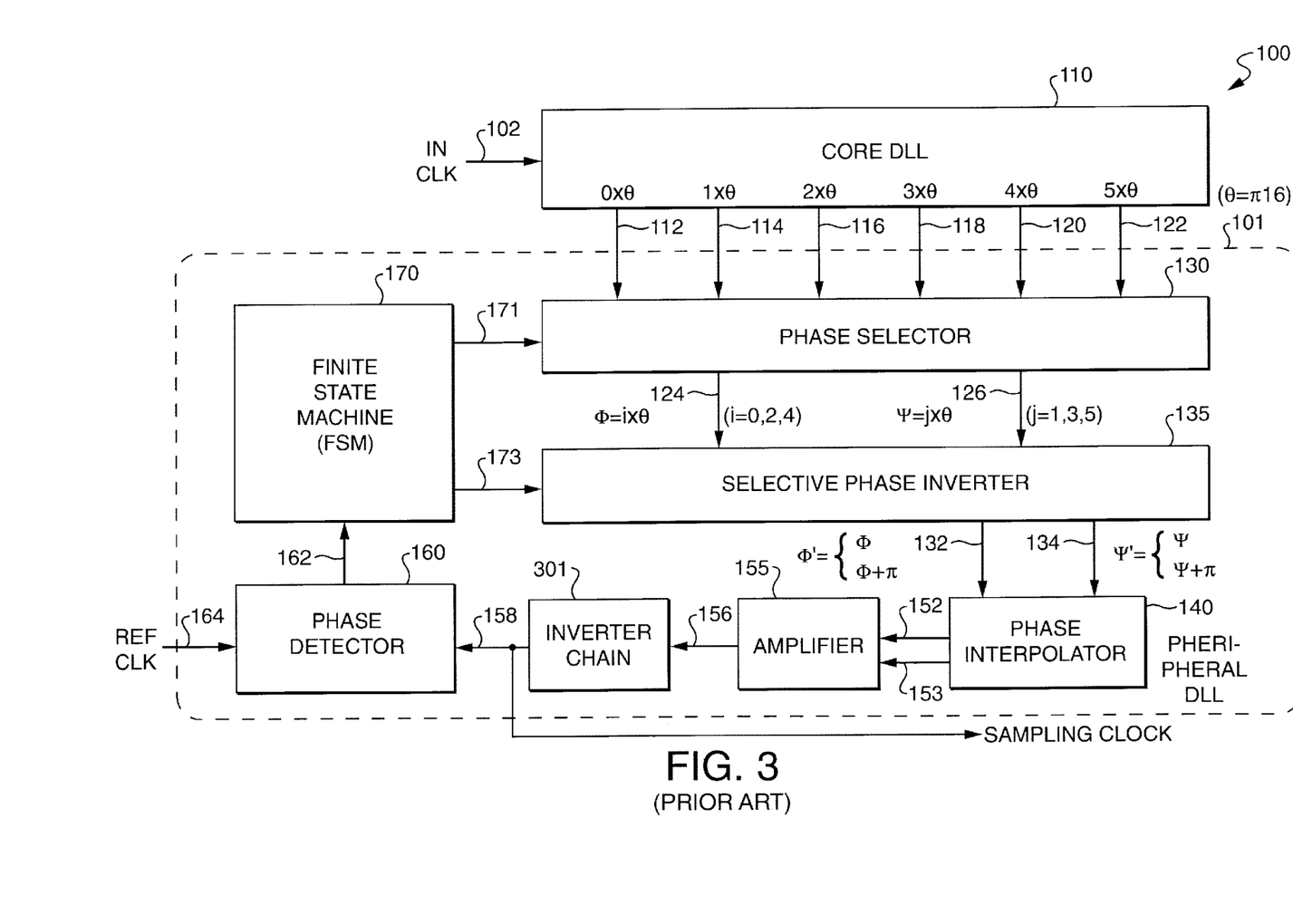
FIG. 3 shows a detailed block diagram of a typical delay locked loop.

FIG. 3 shows a block diagram (100) of a prior art delay locked loop (DLL) architecture. This architecture is based on two cascaded loops: a conventional first-order analog core DLL (110) and a digital peripheral DLL (101). The core DLL (110) is locked at a 180 degrees phase shift. Assuming that the delay line of the core DLL (110) comprises six buffers, their outputs are six clocks having phases evenly spaced by 30 degrees. The core DLL (110) has an input of IN CLK (102) that is used to create the six delayed outputs. The first output is a zero degree phased output (112) with each subsequent output adding an additional 30 degree phase shift at phased outputs (114, 116, 118, 120, 122), respectively.

The peripheral DLL (101) selects a pair of clocks, φ (124) and ψ (126), to interpolate between. The clocks, φ (124) and ψ (126), are selected from the six phased outputs (112, 114, 116, 118, 120, 122) by a phase selector (130). Clocks φ (124) and ψ (126) can potentially be inverted in order to cover the full 0 degree to 360 degree phase range by a selective phase inverter (135). Clocks φ' (132) and ψ' (134) drive a digitally controlled phase interpolator (140) which generates a differential clock: main clock Θ (152) and its complement, main clock Θ_(153). The phase of the main clock Θ (152) (and its complement) can be any of the N quantized phase steps between the phases of clocks φ' (132) and ψ' (134), where 0 . . . N is the interpolation controlling word range. The main clock Θ (152) is approximately equal to φ'+(1−α/16)×(ψ'−φ') where α=(0, 1, . . . , 16).

The main clock Θ (152) and main clock Θ_(153) of the phase interpolator (140) drive an amplifier (155) that increases a voltage swing of the main clock Θ (152) and main clock Θ_(153) to create a larger relative voltage swing at the amplifier output (156). The amplifier output (156) characteristics may follow the main clock Θ (152) characteristics with the larger relative voltage swing. The inverter chain (301) buffers the amplifier output (156). A buffer, for the purposes of this description, creates a copy of the input signal at the output that is better suited to drive a larger load (i.e., generates a rise or fall time of the output signal similar to the input signal even though the amount of resistance and/or capacitance attached to the output is greater). The inverter chain (301) buffers the amplifier output (156) and generates an inverter chain output (158) to drive a sampling clock (i.e., latching signal) of one or more receivers.

The inverter chain output (158) also drives a phase detector (160) that compares the inverter chain output (158) to a reference clock, REF CLK, (164). A phase detector output (162) is used by a finite state machine (FSM) (170) to control the phase selector (130) and the selective phase inverter (135), through FSM control lines (171, 173), respectively. The finite state machine (FSM) (170) also controls the phase interpolator (140) mixing weight (not shown).

The FSM (170) adjusts the phase of the main clock Θ (152) and main clock Θ_(153) according to the phase detector output (162). Generally, this means just changing the phase interpolator (140) mixing weight by one. If, however, the phase interpolator (140) controlling word has reached its minimum or maximum limit, the FSM (170) must change the phase of φ (124) or ψ (126) to the next appropriate selection. This phase selection change might also involve an inversion of the corresponding clock if the current interpolation interval is adjacent to the 0 degree or 180 degree boundary. Since these phase selection changes happen only when the corresponding phase mixing weight is zero, no glitches occur on the output clock. The digital "bang-bang" nature of the control results in dithering around the zero phase error point in the lock condition. The dither amplitude is determined by the phase interpolator (140) and the delay through the peripheral DLL (101).

In this architecture, the main clock Θ (152) and main clock Θ_(153) phase can be rotated, so no hard limits exist in the loop phase capture range: the loop provides unlimited (modulo 2π) phase shift capability. This property eliminates boundary conditions and phase relationship constraints. The only requirement is that the IN CLK (102) and REF CLK (164) are plesiochronous (i.e., their frequency difference is bounded), making this architecture suitable for clock recovery applications.

Figure 4A:
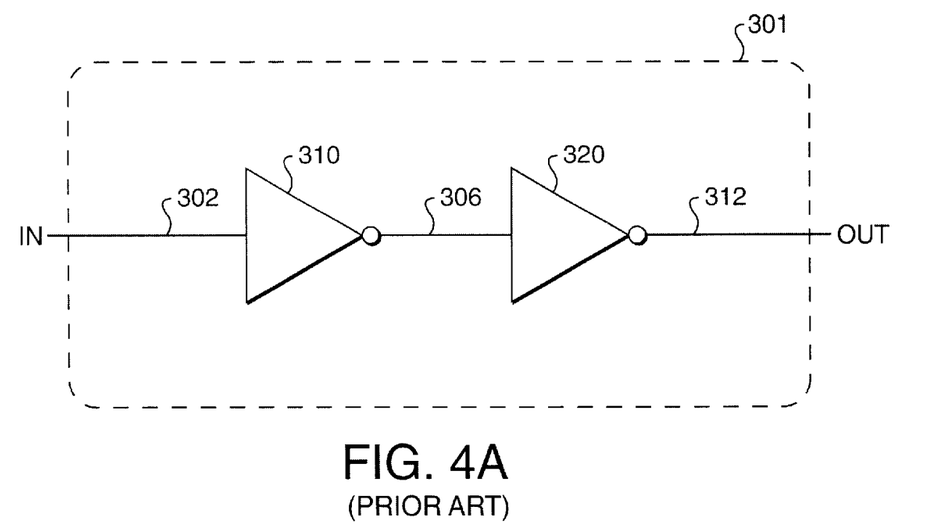
FIG. 4a shows an output buffer circuit.

In FIG. 3, the sampling clock may be heavily loaded or must be routed relatively long distances. This condition may create unwanted distortions in these signals. A common resolution is to buffer the signals. Ideally, a buffer produces an output signal closely matched to the characteristics of an input signal but allows a greater load on the output than could be tolerated on the input signal. Additional concerns are the match between the output versus input signals when various operating conditions exist (e.g., temperature, power supply noise, etc.) and across variations in the manufacture of the buffer and associated circuits. In FIG. 4a, the inverter chain (301) is shown. FIG. 4a details the circuits used in a typical output buffer. This circuit may be used, for example, at the output of the amplifier (155) to buffer the amplifier output (156) in FIG. 3. A signal IN (302) is input into a typical inverter (310) that inverts the signal IN (302) at an output (306). The output (306) goes to another inverter (320) that again inverts the signal and is output on signal OUT (312). By creating a chain of even numbered inverters, the signal IN (302) is buffered without a difference in state between the input on signal IN (302) and output on signal OUT (312) to drive out to other signals.

Figure 4B:
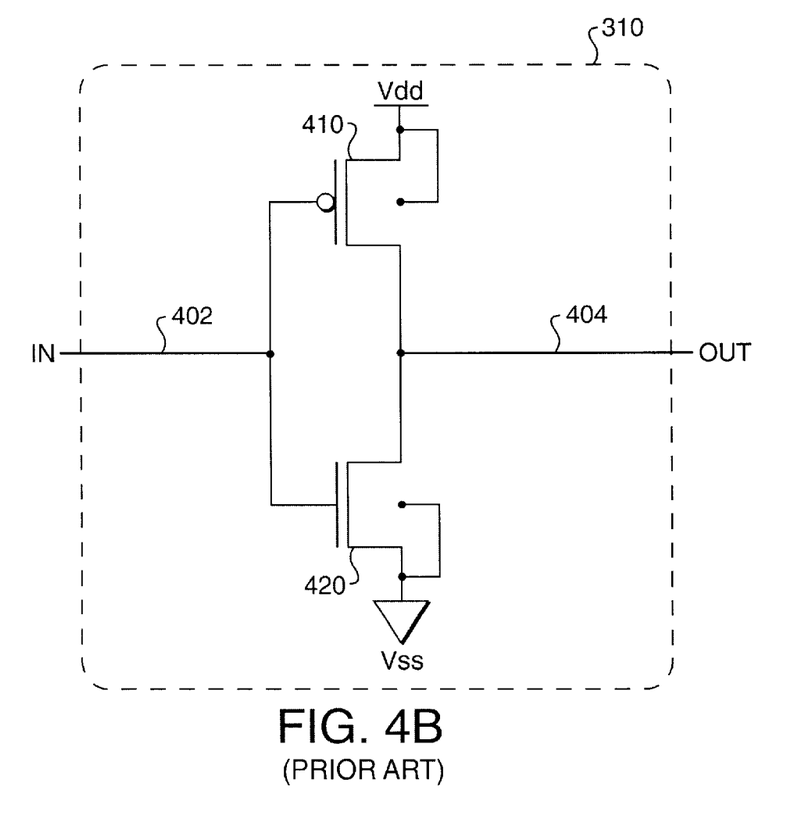
FIG. 4b shows a transistor level drawing of the components used in the output buffer.

In FIG. 4b, a circuit detail of an inverter (310) is shown. The input signal (402) is input to both gates of a p-channel device (410) and a n-channel device (420). When the input signal (402) has a high potential (Vdd), the n-channel device (420) is 'on' and the p-channel device (410) is 'off'. An output signal (404) is ground (Vss). This is an inversion of the input signal (402). When the input signal (402) is ground (Vss), the p-channel device (410) is 'on' and the n-channel device (420) is 'off'. The output signal (404) is pulled to the high potential (Vdd). By cascading an even number of inverters (310), as shown in FIG. 4a, inverter chain (301) is created.

The purpose of an output buffer is to output signals that have the same characteristics as the input signals. The delay locked loop operation relies on the fact that the output buffer maintains similar characteristics between the output signal compared to the input signal. Typically, the input signal has a 50% duty cycle. In other words, the input signal is at a first potential 50% of the time and a second potential 50% of the time. One possible error is a duty cycle offset in which the input has a first potential 50% of the time and a second potential 50% of the time, however, the output does not. For example, inverter chain (301) may have the channel lengths and widths of the n-channel devices and p-channel devices, such that for the nominal process corner and temperature; the input and output of inverter chain (301) may have a first potential 50% of the time and a second potential 50% of the time. However, when the actual processing and/or temperature varies from the nominal case, an error in the signal's output duty cycle results.

Another potential error is poor spectral purity of the output previously described. The impurity is often called "jitter" in the time domain. Jitter measures the perturbations that result in the intermittent shortening or lengthening of signal elements. Jitter is directly proportional to power supply noise. For example, jitter may increase by 0.3 ps/mV of noise. Reducing power supply noise has costs associated with it. The typical inverter chain (301) used to drive the phase detector (160) in the peripheral DLL (101) and the sampling clock for latching an input at the receiver is very sensitive to supply noise, therefore, potentially causing large amounts of jitter. The other circuits in the DLL are designed to have low jitter leaving the inverter chain (301) as the dominant source of jitter. Because of these two error sources, it is desirable to have a buffer circuit that causes a much smaller duty cycle error across process and temperature, and is more tolerant to power supply noise.

Figure 5:
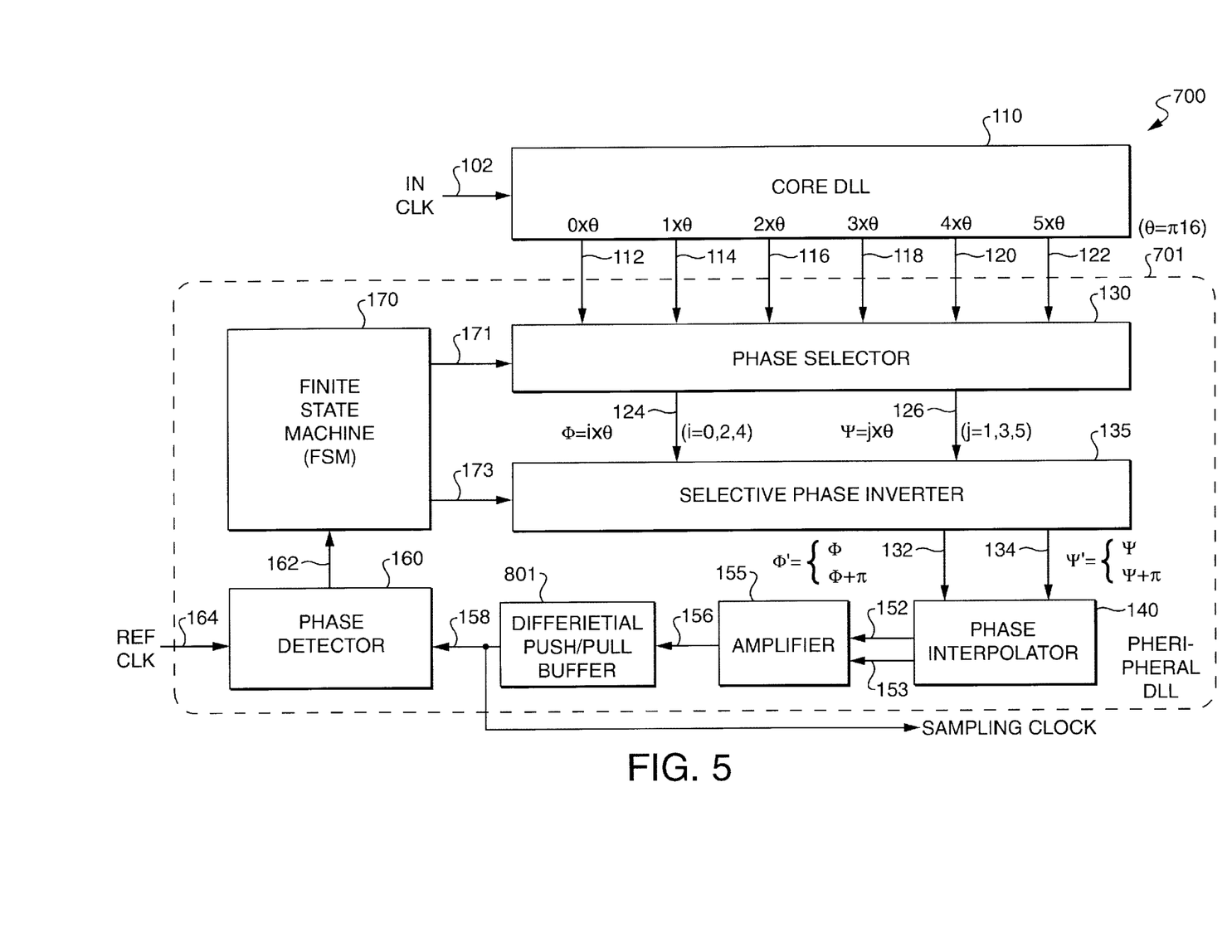
FIG. 5 shows a block diagram in accordance with an embodiment of the present invention.

In FIG. 5, an exemplary delay locked loop block diagram in accordance with an embodiment of the present invention is shown. Block diagram (700) shows a delay locked loop (DLL) architecture. As in FIG. 3, this architecture is based on two cascaded loops: a first-order analog core DLL (110) and a digital peripheral DLL (701). The first-order analog core DLL (110) operates as described previously. The first output is a zero degree phased output (112) with each subsequent output adding an additional 30 degree phase shift at phased outputs (114, 116, 118, 120, 122), respectively.

The peripheral DLL (701) operates as described above for all similarly numbered blocks in the peripheral DLL (101) shown in FIG. 3. The peripheral DLL (701) is different from the peripheral DLL (101) in that the amplifier output (156) from amplifier (155) drives a differential push/pull buffer (801) to generate the sampling clock (158).

Those skilled in the art will appreciate that in FIG. 5 the phase detector (160) and the finite state machine (170) form a phase adjustment device. Those skilled in the art will further appreciate that the core DLL (110), phase selector (130), selective phase inverter (135), phase interpolator (140), and amplifier (155) form a delay element.

Figure 6:
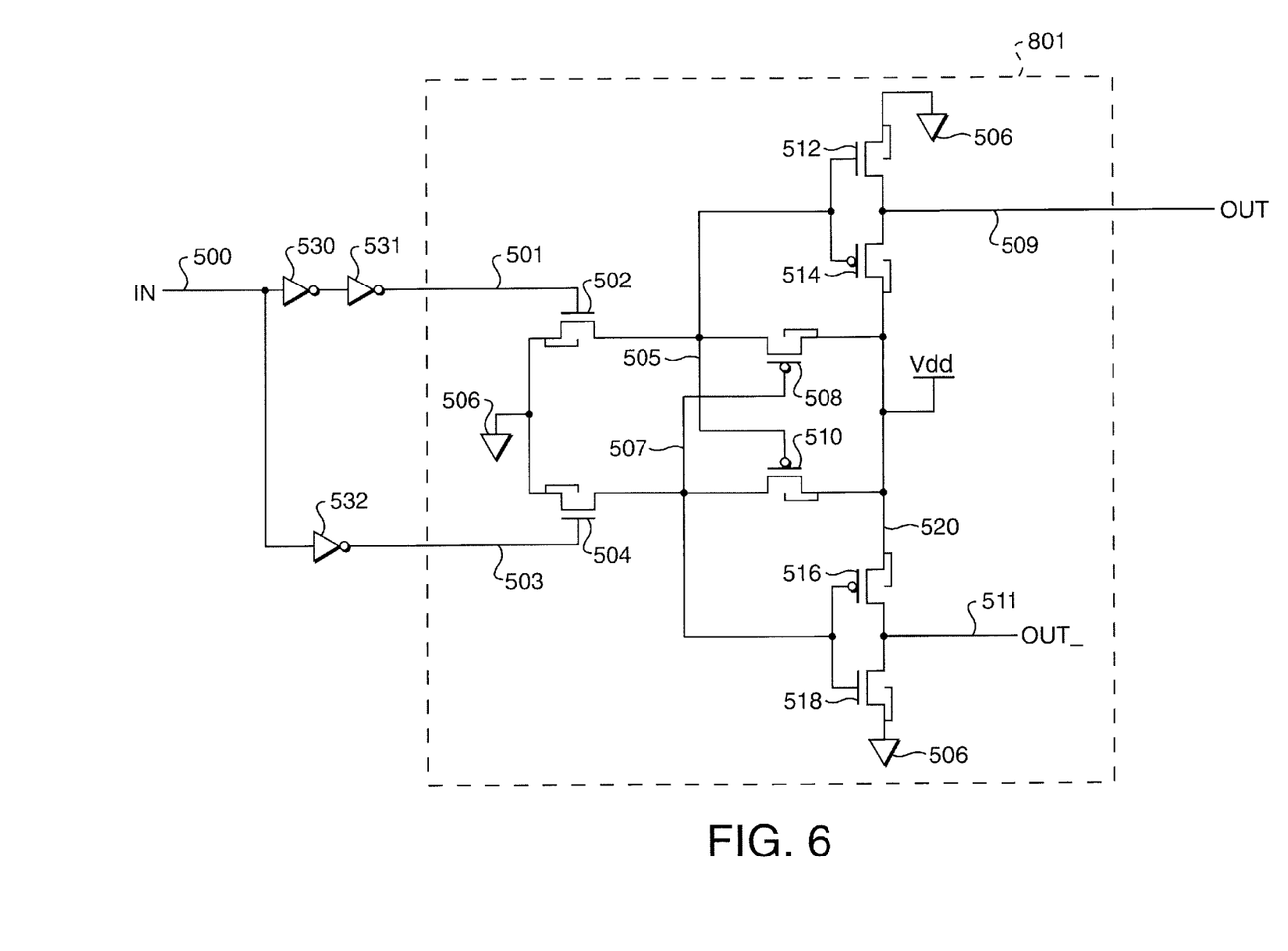
FIG. 6 shows a transistor level drawing in accordance with another embodiment of the present invention.

In FIG. 6, a transistor level drawing of an exemplary differential push/pull buffer (801) in accordance with an embodiment of the present invention is shown. An input IN (500) is used to generate differential signals (501, 503) by using a buffer created from two inverters (530, 531) and an inverter (532), respectively. Differential signals (501, 503) connect to the gates of n-channel devices (502, 504), respectively. As only one of the complimentary signals is logic high, only one of the n-channel devices (502 or 504) will be 'on'. For example, assuming input IN (500) is logic high, differential signal (501) is logic high and differential signal (503) is logic low; therefore, n-channel device (502) is 'on'. Because differential signal (503) is logic low, n-channel device (504) is 'off'. In this example, n-channel device (502) is 'on'; therefore, signal line (505) will have a low potential since n-channel device (502) is connected to signal line (505) and also to ground (506). The p-channel device (514) and n-channel device (512) create an inverter structure that is obvious to one skilled in the art. Because signal line (505) has a low potential, the output of the p-channel device (514) and n-channel device (512) on signal line OUT (509) is high. Signal line (505) is also connected to a p-channel device (510). Because signal line (505) has a low potential, p-channel device (510) is 'on'. Because p-channel device (510) is 'on', signal line (507) is at a high potential. The high potential on the gates of p-channel device (516) and n-channel device (518), that is obviously an inverter, will produce a low potential signal on signal line OUT (511). As the input IN (500) changes potential, the collection of n-channel devices and p-channel devices that were 'on', will be turned 'off', and those that were 'off' will be turned 'on'. For example, if input IN (500) is logic low, n-channel device (502) will be 'off'. Likewise, n-channel device (504) will be 'on'. Because n-channel device (504) is 'on', signal line (507) will be pulled low through n-channel device (504) since it is connected to signal line (507) and ground (506). The signal line (507) will be inverted through the inverter structure composed at p-channel device (516) and n-channel device (518) so that signal line OUT_(511) is at a high potential. Signal line (507) also connects to p-channel device (508) which will be turned 'on' and create a high potential on signal line (505). A high potential on signal line (505) turns 'off' p-channel device (510) and is inverted through the inverter structure composed of p-channel device (514) and n-channel device (512) to output a low potential on signal line OUT (509). The circuit elements described above create a differential push/pull buffer whose purpose is not unlike that of inverter chain (301) in FIG. 4a used as a buffer. To create a single input arrangement as in the inverter chain (301) in FIG. 4a, the buffer created from two inverters (530, 531) and inverter (532) are added at the beginning of the differential push/pull buffer (801). To create a single output arrangement as in the inverter chain (301) in FIG. 4a, only one of the available outputs, output (509), of the differential push/pull buffer (801) is used.

Those skilled in the art will appreciate that the differential push/pull buffer may be cascaded, similar to cascading an even number of inverters, by copying multiple differential push/pull buffers. To create a cascaded chain of differential push/pull buffers, another instantiation of the differential push/pull buffer may be connected to signal line OUT (509) and signal OUT_(511) to differential signals (501, 503), respectively.

Those skilled in the art will appreciate that the differential push/pull buffer (801) may be used as a differential element if differential signals are available from the amplifier (155). In this case, the differential signals from the amplifier (155) may be connected to the differential signals (501, 503). Also, both of the differential output signals, signal line OUT (509) and signal OUT (511), may be used as an input to the phase detector (160) if the phase detector requires a differential input. Using two copies of the inverter chain (301) in parallel provides the same connectivity as the differential push/pull buffer (801) used as a differential element.

Those skilled in the art will appreciate that a differential push/pull buffer may provide less duty cycle error over operating conditions such as temperature and process (manufacturing) variations compared to conventional buffers. Those skilled in the art will appreciate that a differential push/pull buffer may be more tolerant to jitter over operating conditions such as power supply noise compared to conventional buffers.

Those skilled in the art will appreciate that a DLL is described that employs two loops; however, a single loop DLL would also benefit from the use of a differential push/pull buffer. For example, the buffer (54) in FIG. 2, may comprise a differential push/pull buffer (801). Those skilled in the art will further appreciate that both an analog DLL and a digital DLL may benefit from the use of a differential push/pull buffer. Those skilled in the art will appreciate that use of a differential push/pull buffer has desirable features over an inverter chain. Furthermore, those skilled in the art will appreciate that the minimum requirements of a delay locked loop are a phase adjustment device, a delay element, and a buffer. The phase adjustment device has a phase detector and delay controls to adjust the amount of the delay of a delay element. The delay element, or equally a phase selection device or interpolation device, produces a delayed output signal relative to an input signal. The delay element outputs a signal directly or indirectly to a buffer that comprises a differential push/pull buffer in this description. Those skilled in art will also appreciate that a differential push/pull buffer may be used within a DLL at locations other than as a buffer for a delay element, or equally a phase selection device or interpolation device. For example, any signal that requires a buffer due to the load that must be driven may use a differential push/pull buffer. For example, any signal that is susceptible to duty cycle errors or jitter may use a differential push/pull buffer.

Those skilled in art will appreciate that a differential push/pull buffer provides a coupling between the circuits involved with each one of the two differential signals, such that one of the differential signals has an effect on the other.

Those skilled in art will appreciate that a differential push/pull buffer may have a reduced swing differential input that does not consistently reach a high or low potential where the high or low potential is essentially at the same potential as the supply potential.

Those skilled in art will appreciate that a delay locked loop incorporating a differential push/pull buffer may be manufactured as an integrated circuit as a functional subsection of the chip or as the entire function of the chip.

Advantages of the present invention may include one or more of the following. In some embodiments, because a differential signal is used, output duty cycle differences compared to the input may be reduced over operating conditions such as temperature and process (manufacturing) variations, effectively leading to better system performance.

In some embodiments, because a differential push/pull buffer is used, output jitter differences compared to the input may be reduced over operating conditions such as power supply noise, effectively leading to better system performance.

In some embodiments, because a differential push/pull buffer is used, output skew between differential signals may be reduced over operating conditions such as temperature, voltage, and power supply noise variations and process (manufacturing) variations, effectively leading to better system performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A delay locked loop, comprising:

a delay element that outputs a delayed signal that is delayed relative to an input signal;

a differential push/pull buffer that receives the delayed signal to generate a buffered output signal, wherein the differential push/pull buffer comprises cross-coupled transistors; and a phase adjustment device operatively connected to the delay element to adjust the delay of the delay element based on a phase difference between a reference signal and the buffered output signal.

2. The delay locked loop of claim 1, wherein the input signal is a clock signal.

3. The delay locked loop of claim 1, wherein the buffered output signal is differential.

4. The delay locked loop of claim 1, wherein the delayed signal comprises a first differential signal component and a second differential signal component and wherein the differential buffer generates a first buffered output signal component and a second buffered output signal component.

5. The delay locked loop of claim 4, wherein the first differential signal component and the second differential signal component are used to generate the first buffered output signal component.

6. The delay locked loop of claim 4, wherein the first differential signal component and the second differential signal component are used to generate the second buffered output signal component.

7. The delay locked loop of claim 1, wherein the delayed signal has a reduced voltage swing relative to a voltage swing of the buffered output signal.

8. The delay locked loop of claim 1, wherein the phase adjustment device comprises a phase detector.

9. The delay locked loop of claim 1, wherein the phase adjustment device comprises a finite state machine.

10. The delay locked loop of claim 1, wherein the delay element comprises a phase selector.

11. The delay locked loop of claim 1, wherein the delay element comprises a phase interpolator.

12. An integrated circuit, comprising:

a delay locked loop, comprising:

a delay element that outputs a delayed signal that is delayed relative to an input signal;

a differential push/pull buffer that receives the delayed signal to generate a buffered output signal, wherein the differential push/pull buffer comprises cross-coupled transistors; and a phase adjustment device operatively connected to the delay element to adjust the delay of the delay element based on a phase difference between a reference signal and the buffered output signal.

13. The integrated circuit of claim 12, wherein the input signal is a clock signal.

14. The integrated circuit of claim 12, wherein the buffered output signal is differential.

15. The integrated circuit of claim 12, wherein the delayed signal comprises a first differential signal component and a second differential signal component and wherein the differential buffer generates a first buffered output signal component and a second buffered output signal component.

16. The integrated circuit of claim 15, wherein the first differential signal component and the second differential signal component are used to generate the first buffered output signal component.

17. The integrated circuit of claim 15, wherein the first differential signal component and the second differential signal component are used to generate the second buffered output signal component.

18. The integrated circuit of claim 12, wherein the delayed signal has a reduced voltage swing relative to a voltage swing of the buffered output signal.

19. The integrated circuit of claim 12, wherein the phase adjustment device comprises a phase detector.

20. The integrated circuit of claim 12, wherein the phase adjustment device comprises a finite state machine.

21. The integrated circuit of claim 12, wherein the delay element comprises a phase selector.

22. The integrated circuit of claim 12, wherein the delay element comprises a phase interpolator.

23. A delay locked loop, comprising:

delaying means for delaying an input signal and outputting a delayed signal;

buffering means for buffering the delayed signal and outputting a buffered output signal comprising cross-coupled transistors; and adjusting means for adjusting a degree of delay of the delaying means based on a phase difference between a reference signal and the buffered output signal.

24. The delay locked loop of claim 23, wherein the buffering means comprises a differential push/pull buffer.

25. The delay locked loop of claim 23, wherein the delayed signal comprises a first differential signal component and a second differential signal component and wherein the buffering means generates a first buffered output signal component and a second buffered output signal component.

26. The delay locked loop of claim 25, wherein the buffering means generates the first buffered output signal component from the first differential signal component and the second differential signal component.

27. The delay locked loop of claim 25, wherein the buffering means generates the second buffered output signal component from the first differential signal component and the second differential signal component.

28. The delay locked loop of claim 23, wherein the delayed signal has a reduced voltage swing relative to a voltage swing of the buffered output signal.

29. The delay locked loop of claim 23, wherein the adjusting means comprises a phase detector.

30. The delay locked loop of claim 23, wherein the adjusting means comprises a finite state machine.

31. The delay locked loop of claim 23, wherein the delaying means comprises a phase selector.

32. The delay locked loop of claim 23, wherein the delaying means comprises a phase interpolator.

33. A method for generating a sampling clock, comprising:

inputting a clock signal to a delay element;

generating a delayed clock signal that is delayed relative to the clock signal;

inputting the delayed clock signal to a differential push/pull buffer, wherein
the differential push/pull buffer comprises cross-coupled transistors; and buffering the delayed clock signal to generate a buffered clock signal, wherein the buffering comprises cross-coupled transistors.

34. The method of claim 33, further comprising:

adjusting a delay of the delay element based on a phase difference between a reference clock signal and the buffered clock signal.

35. The method of claim 33, wherein the buffered clock signal is the sampling clock.

36. The method of claim 33, wherein the buffered clock signal is differential.

37. The method of claim 33, wherein the delayed clock signal comprises a first differential clock signal component and a second differential clock signal component and wherein the differential push/pull buffer generates a first buffered clock signal component and a second buffered clock signal component.

38. The method of claim 37, wherein the first differential clock signal component and the second differential clock signal component are used to generate the first buffered clock signal component.

39. The method of claim 37, wherein the first differential clock signal component and the second differential clock signal component are used to generate the second buffered clock signal component.

40. The method of claim 33, wherein the delayed clock signal has a reduced voltage swing relative to a voltage swing of the buffered clock signal.

41. The method of claim 34, wherein a phase adjustment device adjusts the delay of the delay element.

42. The method of claim 41, wherein the phase adjustment device comprises a finite state machine.

43. The method of claim 33, wherein the delay element comprises a phase selector.

44. The method of claim 33, wherein the delay element comprises a phase interpolator.

* * * * *